US 011521870B2

(12) United States Patent
Kamesh (10) Patent No.: US 11,521,870 B2
(45) Date of Patent: Dec. 6, 2022

(54) ANNEALING CHAMBER

(71) Applicant: Applied Materials, Inc., Santa Clara, CA (US)

(72) Inventor: Giridhar Kamesh, Bengaluru (IN)

(73) Assignee: Applied Materials, Inc., Santa Clara, CA (US)

( * ) Notice: Subject to any disclaimer, the term of this patent is extended or adjusted under 35 U.S.C. 154(b) by 21 days.

(21) Appl. No.: 16/923,818

(22) Filed: Jul. 8, 2020

(65) Prior Publication Data

US 2022/0013386 A1 Jan. 13, 2022

(51) Int. Cl.
*H01L 21/67* (2006.01)
*H01L 21/677* (2006.01)

(52) U.S. Cl.
CPC .. *H01L 21/67207* (2013.01); *H01L 21/67109* (2013.01); *H01L 21/67248* (2013.01); *H01L 21/67709* (2013.01)

(58) Field of Classification Search
CPC ......... H01L 21/67207; H01L 21/67109; H01L 21/67248; H01L 21/67709; H01L 21/67115; H01L 21/67173; H01L 21/6776; H01L 21/67103
See application file for complete search history.

(56) References Cited

U.S. PATENT DOCUMENTS

| | | | |
|---|---|---|---|
| 5,180,048 A | 1/1993 | Kawada et al. | |
| 5,323,847 A * | 6/1994 | Koizumi | H05K 7/20645 165/200 |
| 5,641,054 A | 6/1997 | Mori et al. | |
| 6,206,176 B1 * | 3/2001 | Blonigan | H01L 21/67709 414/217 |
| 7,017,654 B2 * | 3/2006 | Kenny | H01L 21/4871 174/15.1 |
| 7,293,950 B2 | 11/2007 | Bonora et al. | |
| 7,438,175 B2 * | 10/2008 | White | H01L 21/67739 414/217 |

(Continued)

FOREIGN PATENT DOCUMENTS

| | | |
|---|---|---|
| JP | 62121134 | 6/1987 |
| JP | H07117847 A | 5/1995 |

(Continued)

OTHER PUBLICATIONS

International Search Report dated Apr. 25, 2016 for Application No. PCT/US2016/012600.

(Continued)

*Primary Examiner* — Mohammed Shamsuzzaman
(74) *Attorney, Agent, or Firm* — Patterson + Sheridan, LLP (57) ABSTRACT

Embodiments disclosed herein generally include annealing chambers. The annealing chambers allow for high throughput without sacrificing wafer-to-wafer and within wafer uniformity. The annealing chamber includes a transport system, a substrate carrier, and a plurality of thermal sources. The transport system is magnetically coupled to the substrate carrier. The transport system moves the substrate carrier along a path. A substrate supported by the substrate carrier is annealed by the thermal sources. The annealing chamber described herein allows for a higher throughput of substrate (alternatively referred to as a wafer) annealing compared to furnace annealing chambers.

20 Claims, 5 Drawing Sheets

(56) References Cited

U.S. PATENT DOCUMENTS

| | | | |
|---|---|---|---|
| 7,591,302 B1 * | 9/2009 | Lenehan | H01L 23/473 165/104.33 |
| 7,841,820 B2 | 11/2010 | Bonora et al. | |
| 7,948,122 B2 | 5/2011 | Compter et al. | |
| 8,066,466 B2 | 11/2011 | Rice et al. | |
| 8,851,817 B2 | 10/2014 | Bonora et al. | |
| 9,147,592 B2 | 9/2015 | Englhardt et al. | |
| 9,862,554 B2 * | 1/2018 | Caveney | H01L 21/67178 |
| 10,056,279 B2 | 8/2018 | Janakiraman et al. | |
| 10,236,197 B2 | 3/2019 | Janakiraman et al. | |
| 2004/0023495 A1 | 2/2004 | Butterfield et al. | |
| 2006/0180174 A1 * | 8/2006 | Kevwitch | H01L 21/02101 427/248.1 |
| 2007/0002692 A1 | 11/2007 | Meulen et al. | |
| 2007/0269297 A1 * | 11/2007 | Meulen | H01L 21/68792 414/416.01 |
| 2008/0029368 A1 * | 2/2008 | Komori | B61B 13/08 198/619 |
| 2008/0175694 A1 | 7/2008 | Park et al. | |
| 2010/0226737 A1 | 9/2010 | Sakaue et al. | |
| 2011/0178626 A1 * | 7/2011 | Kondoh | H01L 21/67766 700/108 |
| 2011/0312189 A1 | 12/2011 | Kim et al. | |
| 2012/0109355 A1 * | 5/2012 | Baccini | H01L 21/67196 310/12.06 |
| 2012/0213614 A1 * | 8/2012 | Bonora | H01L 21/67766 414/217 |
| 2014/0003800 A1 | 1/2014 | Ramamurthy et al. | |
| 2015/0000139 A1 | 1/2015 | Krupyshev et al. | |
| 2015/0013910 A1 | 1/2015 | Krupyshev et al. | |
| 2016/0293467 A1 | 10/2016 | Caveney et al. | |
| 2017/0148651 A1 | 5/2017 | Kao et al. | |
| 2018/0076075 A1 * | 3/2018 | Janakiraman | H01L 21/67178 |
| 2018/0141762 A1 * | 5/2018 | Caveney | H01L 21/67173 |
| 2020/0111692 A1 * | 4/2020 | Newman | H01L 21/6773 |
| 2020/0251357 A1 * | 8/2020 | Courville | H01L 21/67017 |

FOREIGN PATENT DOCUMENTS

| | | | | |
|---|---|---|---|---|
| JP | H07122616 A | | 5/1995 | |
| JP | H07172578 A | | 7/1995 | |
| JP | H07176591 A | | 7/1995 | |
| JP | 3625127 B2 | | 3/2005 | |
| KR | 2014/0133534 A | | 11/2014 | |
| TW | 200401046 A | * | 1/2004 | C23C 14/566 |
| WO | 2007/101228 A2 | | 9/2007 | |
| WO | WO-2011137371 A2 | * | 11/2011 | C23C 16/4587 |
| WO | WO-2014163776 A1 | * | 10/2014 | H01L 21/67706 |
| WO | WO-2017125123 A1 | * | 7/2017 | C23C 14/351 |
| WO | WO-2018197010 A1 | * | 11/2018 | C23C 14/042 |
| WO | 2020/057739 A1 | | 3/2020 | |

OTHER PUBLICATIONS

International Search Report and the Written Opinion of the International Searching Authority for PCT/US2019/054089 dated Feb. 25, 2020, 13 pages.

\* cited by examiner

ANNEALING CHAMBER

BACKGROUND

Field

Embodiments of the present disclosure relate to an apparatus and, more specifically, to an annealing chamber.

Description of the Related Art

One type of annealing chambers used in semiconductor manufacturing are furnace annealing chambers. Furnace annealing consists of heating multiple semiconductor substrates, or wafers, in order to affect their electrical properties. Heat treatments are designed for different effects. For example, wafers can be heated in order to activate dopants, change film to film or film to wafer substrate interfaces, densify deposited films, change states of grown films, repair damage from implants, move dopants or drive dopants from one film into another or from a film into the wafer substrate. Furnace anneals can be integrated into other furnace processing steps, such as oxidations, or furnace anneals can be a separate step.

Furnace anneals are performed by equipment especially built to heat semiconductor wafers. Furnaces are capable of processing lots of wafers at a time, but each process can last between several hours to more than a day. Increasingly, furnace anneals are being supplanted by Rapid Thermal Anneal (RTA) or Rapid Thermal Processing (RTP). This is due to the relatively long thermal cycles of furnaces that causes the dopants that are being activated, especially boron, to diffuse farther than is intended. RTP or RTA fixes this by having thermal cycles for each wafer that is of the order of minutes rather than hours for furnace anneals.

While furnace annealing chambers have a high throughput because of the large number of wafers processed simultaneously, they suffer from two drawbacks; wafers being processed in large batches result in long cycles between batches of wafers, and they also suffer from reduced wafer to wafer (WTW) and within wafer (WIW) uniformity.

Therefore, what is needed in the art is an annealing chamber with high throughput and annealing uniformity.

SUMMARY

Embodiments disclosed herein generally include annealing chambers. The annealing chambers allow for high throughput without sacrificing WTW and WIW uniformity.

In one embodiment, an annealing chamber is provided. The annealing chamber includes a transport system, a substrate carrier, and a heating system. The substrate is carrier configured to support a substrate. The substrate carrier includes a carrier base and one or more carrier magnets. The one or more carrier magnets are configured to magnetically couple to the transport system. The heating system includes a plurality of thermal sources. The transport system is configured to move the substrate carrier along a path.

In another embodiment, an annealing system is provided. The annealing chamber includes a transport system, a substrate carrier, and a heating system. The substrate is carrier configured to support a substrate. The substrate carrier includes a carrier base and one or more carrier magnets. The one or more carrier magnets are configured to magnetically couple to the transport system. The heating system includes a plurality of thermal sources. The transport system is configured to move the substrate carrier along a path. The heating system includes a first plurality of thermal sources configured to heat the substrate to a first temperature and a second plurality of thermal sources configured to heat the substrate to one or more temperatures in a range of temperatures. At least one temperature of the range of temperatures is lower than the first temperature.

In yet another embodiment, an annealing chamber is provided. The annealing chamber includes a transport system, a substrate carrier, a heating system, and a cooling system. The substrate is carrier configured to support a substrate. The substrate carrier includes a carrier base and one or more carrier magnets. The one or more carrier magnets are configured to magnetically couple to the transport system. The heating system includes a plurality of thermal sources. The transport system is configured to move the substrate carrier along a path. The cooling system includes a cooling base, a cooling line disposed in the cooling base, a cooling inlet fluidly coupled to the cooling line, and a cooling pump fluidly coupled to the cooling inlet. The cooling pump is configured to flow a fluid.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein generally include annealing chambers. The annealing chambers allow for high throughput without sacrificing WTW and WIW uniformity. The annealing chamber includes a transport system, a substrate carrier, and a plurality of thermal sources. The transport system is magnetically coupled to the substrate carrier. The transport system moves the substrate carrier along a path. A substrate supported by the substrate carrier is annealed by the thermal sources. A substrate supported by the substrate carrier, floating on a thin film of incoming gases is annealed by the thermal sources. The substrate carrier floats on a thin film of incoming gas. The annealing chamber described herein allows for a higher throughput of substrate (alternatively referred to as a wafer) annealing compared to furnace annealing chambers. Improved WTW and WIW uniformity can be achieved with the disclosed annealing chamber by providing suitable control zones in the heaters, as each wafer experiences a similar processing environment, since each wafer experiences the same path through the annealing chamber. Overall anneal time is also reduced, as sets of thermal sources staggered with different heating temperatures can inherently include preheating and cooling down of substrates. The annealing chamber has a smaller footprint than traditional furnace anneal chambers, which reduces cost-of-ownership. Embodiments disclosed herein can be useful for, but are not limited to, an annealing chamber using a substrate carrier magnetically coupled to a transport system.

As used herein, the term "about" refers to a +/−10% variation from the nominal value. It is to be understood that such a variation can be included in any value provided herein.

Figure 1A:
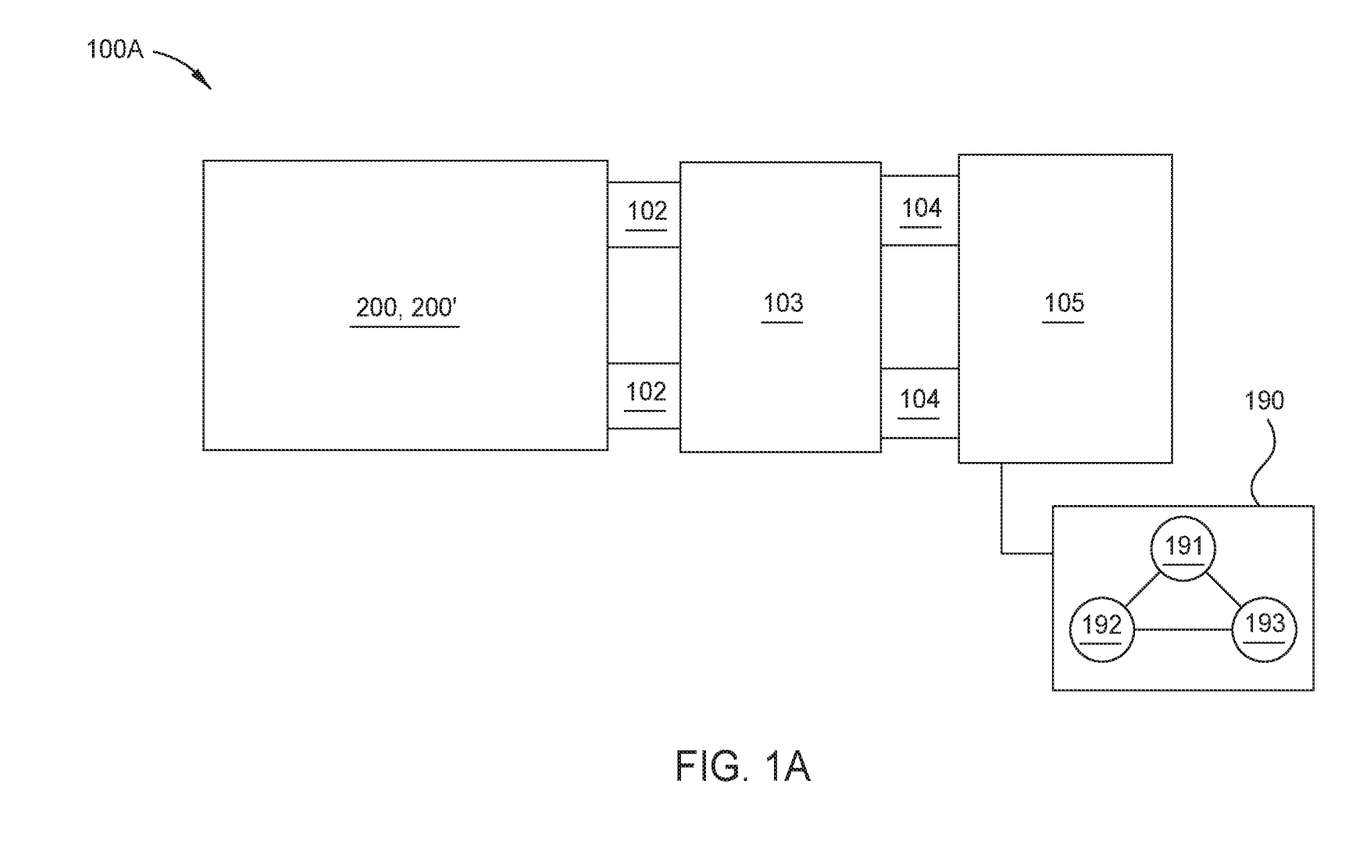
FIG. 1A illustrates an overhead schematic view of a portion of a processing system, according to one embodiment.

FIG. 1A illustrates an overhead schematic view of a portion of a processing system 100A, according to one embodiment. As shown, the processing system 100A includes an annealing chamber 200, 200', one or more primary transfer chambers 102, an intermediate transfer chamber or factory interface (FI) 103, one or more secondary transfer chambers 104, a transfer tool 105, and a controller 190. The processing system 100A is configured to perform a variety of processing operations on one or more substrates contained within the processing system. For example, one or more processing chambers (not shown) are coupled to the transfer tool 105. The processing chambers are configured to process the substrate. For example, the processing chambers are configured to perform atomic layer deposition (ALD), chemical vapor deposition (CVD), physical vapor deposition (PVD), and the like. Transferring substrates, as described below, can be performed by any conventional robot or blade contained within any of the chambers described below. The substrate can be any substrate used in the art for semiconductor processing, solar cell processing, and the like.

Figure 1B:
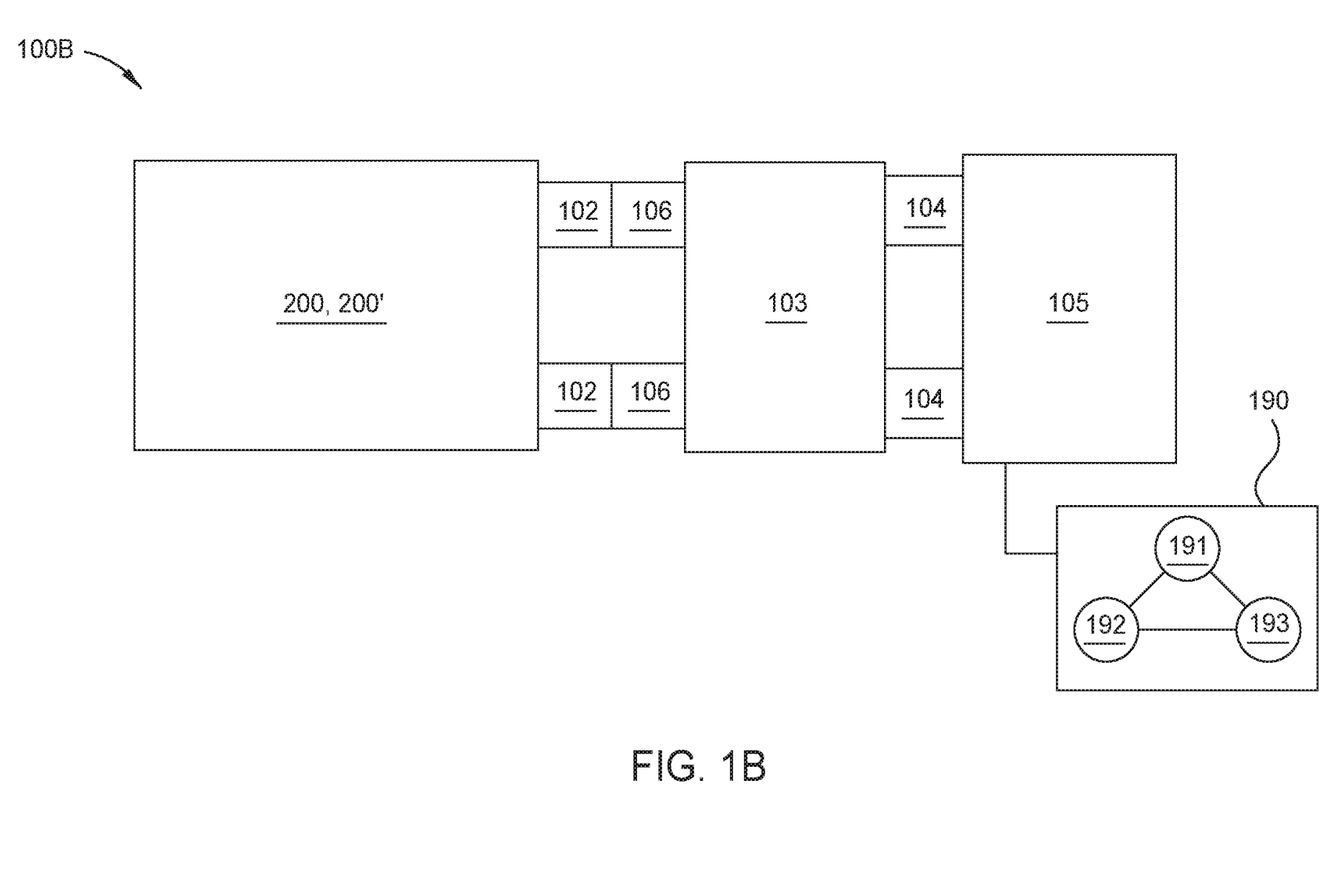
FIG. 1B illustrates an overhead schematic view of a portion of a processing system, according to one embodiment.

The one or more secondary transfer chambers 104 are configured to transfer substrates from a transfer tool (not shown) of the processing systems 100A, 100B (FIGS. 1A-B). The one or more transfer chambers 102 are connected to the intermediate transfer chamber or FI 103. Robots within the intermediate transfer chamber or FI 103 transfer substrates from the one or more secondary transfer chambers 104 to and from the intermediate transfer chamber or FI 103. The intermediate transfer chamber or FI 103 is connected to one or more primary transfer chambers 102. The one or more primary transfer chambers 102 are configured to transfer substrates to and from the annealing chamber 200, 200'.

As shown, the controller 190 includes a central processing unit (CPU) 191, memory 192, and support circuits 193. The CPU 191 is one of any form of computer processors that are used in industrial settings for controlling various processes and hardware (e.g., pattern generators, motors, and other hardware) and monitor the processes (e.g., processing time and substrate position or location). The memory 192 is connected to the CPU 191, and is one or more of a readily available memory, such as random access memory (RAM), read only memory (ROM), floppy disk, hard disk, or any other form of digital storage, local or remote. Software instructions and data can be coded and stored within the memory 192 for instructing the CPU 191. The support circuits 193 are also connected to the CPU 191 for supporting the CPU in a conventional manner. The support circuits 193 include conventional cache, power supplies, clock circuits, input/output (I/O) circuitry, subsystems, and the like. A program (or computer instructions) readable by the controller 190 determines which tasks are performable on a substrate. The program can be software readable by the controller 190 and can include code to monitor and control, for example, the processing time and substrate position or location within the processing systems 100A, 100B.

FIG. 1B illustrates an overhead schematic view of a portion of a processing system 100B, according to one embodiment. The processing system 100B is similar to the processing system 100A, except that the processing system 100B further includes one or more load lock chambers 106. The one or more load lock chambers 106 are disposed between the one or more primary transfer chambers 102 and the FI 103. The one or more load lock chambers 106 are configured to operate at low or ultralow vacuum. In the embodiment shown in FIG. 1B, the annealing chamber 200, 200' is configured to anneal the substrates at low or ultralow vacuum.

Figure 2A:
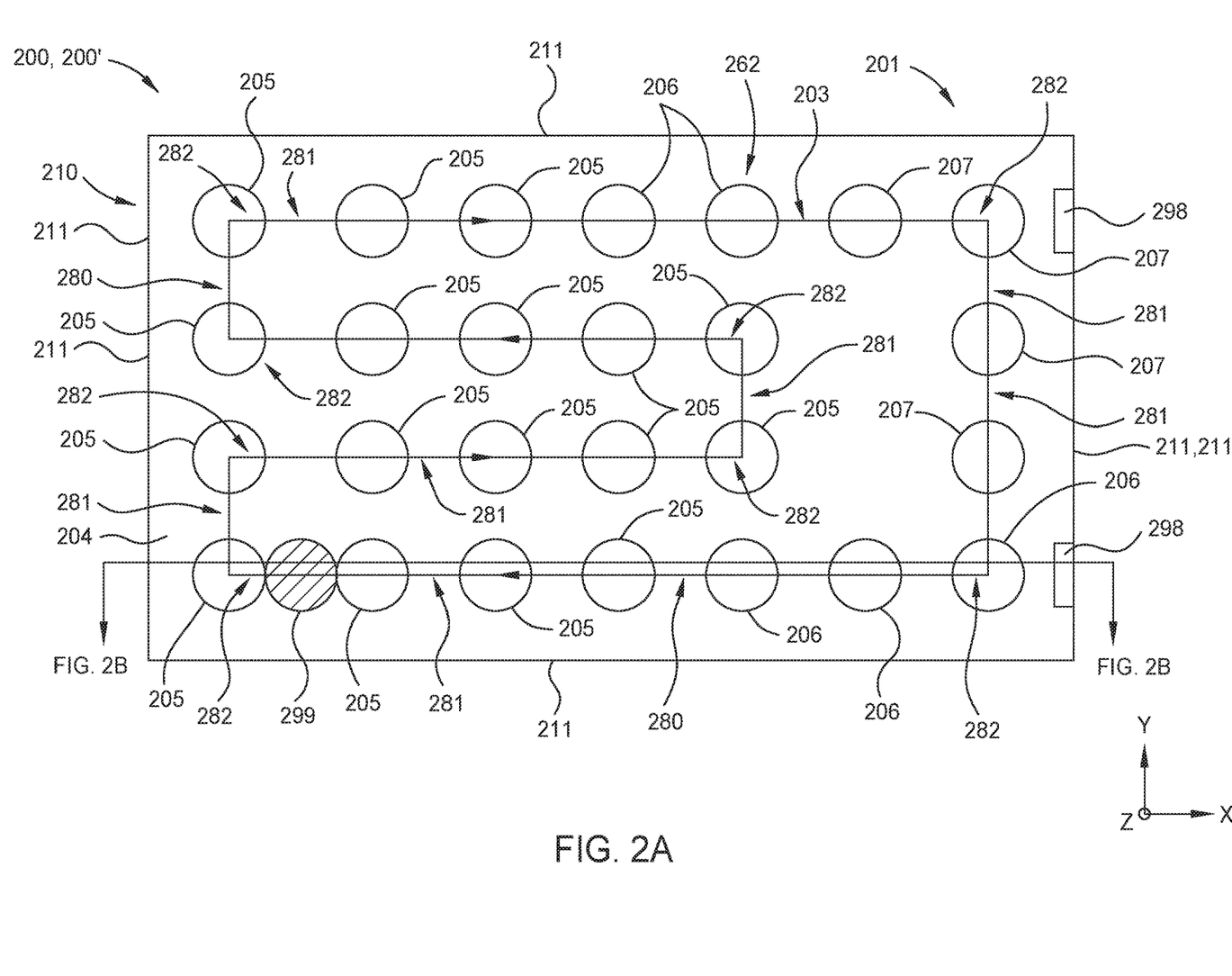
FIG. 2A illustrates a schematic top view of an annealing chamber, according to one embodiment.
Figure 2B:
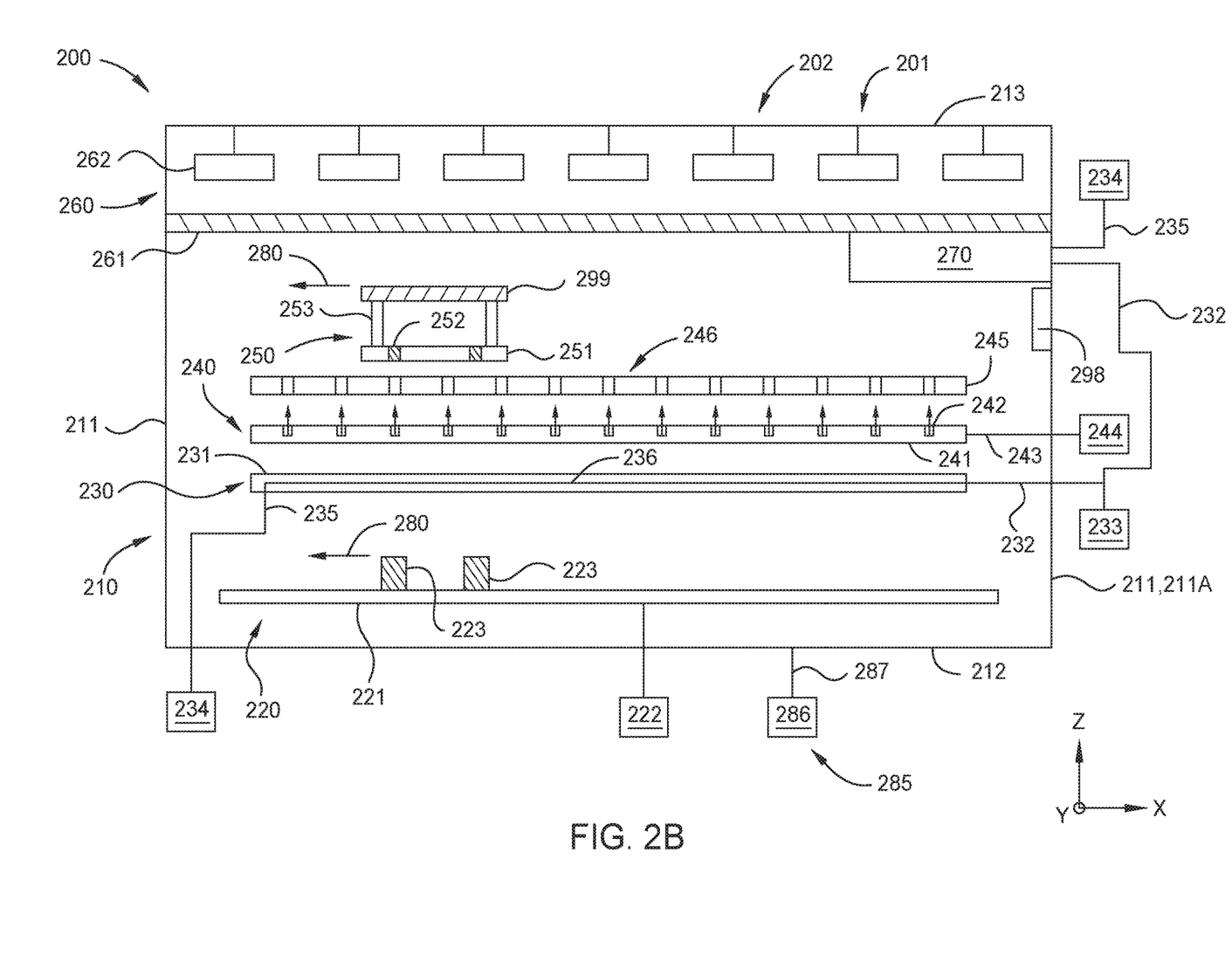
FIG. 2B illustrates a schematic side view of an annealing chamber, according to one embodiment.
Figure 2C:
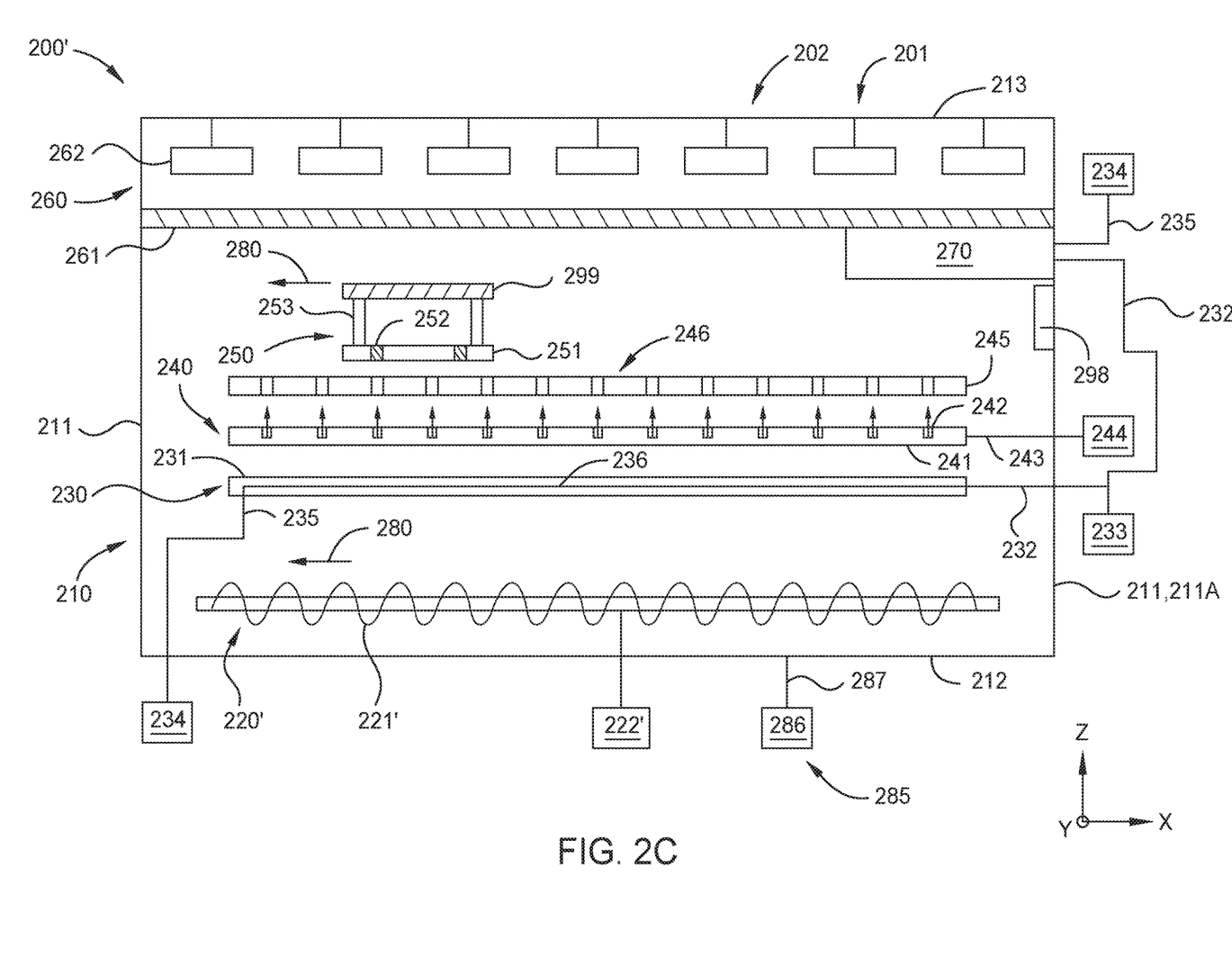
FIG. 2C illustrates a schematic side view of the annealing chamber, according to one embodiment.

FIG. 2A illustrates a schematic top view of the annealing chamber 200, 200', according to one embodiment. FIG. 2B illustrates a schematic side view of the annealing chamber 200, according to one embodiment. FIG. 2C illustrates a schematic side view of the annealing chamber 200', according to one embodiment. The annealing chamber 200, 200' is configured to anneal one or more substrates 299.

As shown, the annealing chamber 200, 200' includes a chamber body 210, a transport system 220 (for the annealing chamber 200 shown in FIG. 2A, B) or transport system 220' (for the annealing chamber 200' shown in FIG. 2A, C), a cooling system 230, a gas flow system 240, a substrate carrier 250, a heating system 260, a cooling cover 270, and a vacuum system 285. The chamber body 210 includes a plurality of chamber walls 211, a chamber bottom 212, and a chamber top 213. The chamber body 210 protects and isolates the various components of the annealing chamber 200, 200' contained therein. One of the plurality of chamber walls 211A includes one or more ports 298. The one or more ports 298 allow for transfer of the substrate 299 from outside the annealing chamber 200, 200' into the annealing chamber. For example, the one or more ports 298 include a substrate loading port and a substrate unloading port. The substrate 299 is transferred from the one or more primary transfer chambers 102 through the one or more ports 298, according to the embodiment shown in FIG. 1A. The substrate 299 is transferred from the one or more load lock chambers 106 through the one or more ports 298, according to the embodiment shown in FIG. 1B.

As shown, the transport system 220 includes a belt 221, a belt actuator 222, and one or more belt magnets 223. The belt actuator 222 is configured to drive the belt 221 in a path 280. The belt 221 can be any typical belt used in conveyor systems. The one or more belt magnets 223 are coupled to the belt 221. The transport system 220 is fastened to the chamber walls 211 and/or the chamber bottom 212 by any conventional means.

The one or more belt magnets 223 include electromagnets or moving electromagnetic fields, according to one embodiment. The one or more belt magnets 223 include a permanent magnet, according to one embodiment. The one or more belt magnets 223 comprise cobalt (Co), according to one embodiment. The transport system 220 is configured to move the substrate carrier 250 with the substrate 299 disposed thereon. The speed of the belt 221 can be controlled such that the total annealing time of the substrate 299 (i.e., the total time spent in the annealing chamber 200) is from about 2 min to about 30 min, such as from about 5 min to about 10 min. Discussion of the movement of the substrate carrier 250 is discussed in more detail below.

As shown, the transport system 220' includes a magnetic track coil apparatus 221' and a current source 222'. The current source 222' is configured to provide a current through one or more coils of the magnetic track coil apparatus 221'. The current is varied through the magnetic track coil apparatus 221' such that time- and space-varying magnetic fields are created. The transport system 220' is configured to move the substrate carrier 250 with the substrate 299 disposed thereon. The speed of the substrate carrier 250 can be controlled by the frequency and phase of the flowed current and the resulting moving magnetic field, such that the total annealing time of the substrate 299 (i.e., the total time spent in the annealing chamber 200') is from about 2 min to about 30 min, such as from about 5 min to about 10 min. The transport system 220' is fastened to the chamber walls 211 and/or the chamber bottom 212 by any conventional means. Discussion of the movement of the substrate carrier 250 is discussed in more detail below.

As shown, the cooling system 230 includes a cooling base 231, a cooling line 236, a fluid inlet 232, a cooling pump 233, a fluid outlet 235, and a fluid destination 234. In some embodiments, the cooling system 230 is a gas cooling system. The cooling system 230 is configured to lower and/or control the temperature of other components of the annealing chamber 200, 200'. If the one or more carrier magnets 252 include a permanent magnet, the cooling system 230 can maintain the permanent magnet below the Curie temperature of the material of the permanent magnet. Thus, the permanent magnet retains its magnetism, even as the substrate 299 is heated to an elevated temperature.

The cooling system 230 can be any conventional system used for convective or radiative cooling. The cooling base 231 is configured to cool the gas flow system 240. The cooling line 236 is disposed in the cooling base 231. The cooling pump 233 is fluidly connected to the fluid inlet 232. The fluid inlet 232 is fluidly connected to the cooling line 236. The cooling line 236 is fluidly connected to the fluid outlet 235. The fluid outlet 235 is fluidly connected to the fluid destination 234. The cooling pump 233 is configured to flow a fluid through the cooling system 230. The fluid includes water, according to one embodiment. The fluid includes one or more gases, such as nitrogen gas ($N_2$), according to one embodiment. The fluid destination 234 can be any conventional destination for the fluid, including a disposal tank or drain. The fluid destination 234 can include a system configured to cool the fluid such that the fluid is sent back to the cooling pump 233, which allows the fluid to be reused.

As shown, the gas flow system 240 includes a gas flow base 241, a plurality of gas flow outlets 242, a gas line 243, a gas source 244, and a perforated surface 245. The plurality of gas flow outlets 242 are disposed in the gas flow base 241. The gas line 243 is fluidly coupled to the plurality of gas flow outlets 242. The gas source 244 is fluidly coupled to the gas line 243. The gas source 244 flows gas from the gas source 244, through the gas line 243, and out the gas flow outlets 242.

The perforated surface 245 is disposed over the gas flow base 241. The perforated surface 245 is cooled by the cooling system 230. The perforated surface 245 includes any nonmagnetic material that does not interfere with the magnetic coupling between the one or more belt magnets 223 and magnets of the substrate carrier 250. In one example, the perforated surface 245 includes austenitic stainless steel.

The perforated surface 245 includes a plurality of perforations 246, such as holes. The perforations 246 optionally include nozzles or valves. The perforations 246 allow for directing the gas in a narrow stream and creating a hydrostatic bearing film to float the substrate carriers.

The gas flow system 240 is configured to support the substrate carrier 250 by flowing the gas, allowing the substrate carrier to float on the gas flow. The gas flowing from the plurality of gas flow outlets 242 flows through the plurality of perforations 246. The gas can include any gas used in the art flowed during annealing. The gas includes a neutral gas, such as nitrogen gas ($N_2$), according to one embodiment. The neutral gas allows for support, or levitation, of the substrate carrier 250 without unwanted interaction between the neutral gas and the substrate 299 disposed on the carrier. The gas also regulates heat flow between the heating system 260 and the substrate 299. The substrate carrier 250 is levitated about 0.025 mm or more above the perforated surface 245. The gas flow system 240 can also include side valves (not shown) that flows gas from the chamber walls 211.

In some embodiments, the gas includes a processing gas, which allows for deposition or modification of the substrate 299 during anneal. In some embodiments, the gas flow on the backside of the substrate 299 results in a backside film deposition.

As shown, the substrate carrier 250 includes a carrier base 251, one or more carrier magnets 252, and one or more support pins 253. The carrier base 251 can include quartz. The one or more support pins 253 support the substrate 299. The one or more carrier magnets 252 include electromagnets, according to one embodiment. The one or more carrier magnets 252 include a permanent magnet, according to one embodiment. The one or more carrier magnets 252 comprise cobalt (Co), iron (Fe), martensitic stainless steel, or any combination of the above, according to some embodiments. The one or more carrier magnets 252 can be embedded in the carrier base 251. The one or more carrier magnets 252 are configured to magnetically couple to the one or more belt magnets 223. The use of magnetic coupling for transporting the substrate carrier 250 instead of direct coupling prevents unwanted chemical reaction between the gas and any means of direct coupling. For example, unwanted chemical reactions of supports between the substrate carrier 250 and the transport systems 220, 220' can be avoided.

The belt 221 can further include a geared magnet holder (not shown) coupled to the one or more belt magnets 223. The geared magnet holder rotates the belt magnets 223, which rotates the substrate carrier 250, and thus the substrate 299. In this manner, the rotating substrate 299 experiences a more uniform thermal environment, decreasing variation of the annealing process across the substrate and improving WIW uniformity.

Although only one substrate carrier 250 and one respectively supported substrate 299 are shown in FIGS. 2A-B, this is for ease of illustration only. Any number of substrate carriers 250 and substrates 299 can be included in the annealing chamber 200, 200'. Increasing the number of substrate carriers 250 and substrates 299 increases throughput of the annealing chamber 200, 200'.

As shown, the heating system 260 includes a plurality of thermal sources 262, a lid 261, and a cooling cover 270. The cooling cover 270 can include stainless steel. The heating system 260 is configured to heat the substrate 299. The lid 261 is disposed between the plurality of thermal sources 262 and the substrate carrier 250. The lid 261 includes any thermally conductive material, such as quartz. The lid 261 allows various electromagnetic wavelengths to pass through from the thermal sources 262 to the substrate 299, without allowing any interaction between the heating elements and the remainder of the substrate processing environment. The lid 261 also enables replacement or repair of the thermal sources 262 without opening the annealing chamber 200, 200'.

The plurality of thermal sources 262 includes any heating or cooling source used in the art, such as a lamp, inductive heater, microwave source, a resistive heater, a chiller, a heat exchanged chill plate, a refrigeration system, a Peltier effect refrigeration system, and any combination of the above. Although the plurality of thermal sources 262 are shown in FIG. 2A as a grid pattern, any pattern can be used, such as a honeycomb or spiral pattern, or any other polygonal pattern. The plurality of thermal sources 262 include a first plurality of thermal sources 205 and a second plurality of thermal sources 206, according to one embodiment. The first plurality of thermal sources 205 is configured to maintain the substrate 299 at a first temperature. The second plurality of thermal sources 206 are configured to heat the substrate to a range of temperatures. At least one temperature of the range of temperatures is lower than the first temperature. Every temperature in the range of temperatures is lower than the first temperature, according to one embodiment. The lower range of temperatures is used to ramp up heating of the substrate 299 to reach the first temperature at a more measured rate.

The plurality of thermal sources 262 further include a plurality of cooling sources 207, according to one embodiment. The cooling sources 207 are configured to cool the temperature of the substrate 299 to a third temperature. The third temperature is lower than at least one of the temperatures in the range of temperatures, according to one embodiment. The third temperature is lower than all of the temperatures in the range of temperatures, according to one embodiment. The cooling sources 207 are configured to ramp down the heating of the substrate 299 from the first temperature (i.e., the processing or annealing temperature), to a lower third temperature at a more measured rate. The plurality of cooling sources 207 are disposed adjacent to the one or more ports 298, according to one embodiment. The lower third temperature of the cooling sources 207 can preheat and cool down the substrate 299 as the substrate enters or leaves the annealing chamber 200, 200', respectively. Any of the temperatures of any of the pluralities of thermal sources 262 can be changed or adjusted over time.

The first temperature is from about 500° C. to about 1100° C., the temperatures in the range of temperatures are from about 100° C. to about 600° C., and the third temperature is from about 20° C. to about 150° C., according to one embodiment.

The cooling cover 270 is disposed between the lid 261 and the substrate carrier 250. The cooling cover 270 is configured to lower the temperature of the substrate 299 disposed on the substrate carrier 250. The annealing chamber 200, 200' includes a first region 204 and a second region 201, and the cooling cover 270 is disposed in the second region, according to one embodiment. Thus, the cooling cover 270 is configured to selectively cool the substrate 299 in only the second region 201.

The cooling pump 233 is fluidly connected to the fluid inlet 232. The fluid inlet 232 is fluidly connected to the cooling line 236. The cooling line 236 is fluidly connected to the fluid outlet 235. The fluid outlet 235 is fluidly connected to the fluid destination 234. The cooling pump 233 is configured to flow a fluid through the cooling system 230. The fluid includes water, according to one embodiment. As shown in FIGS. 2A-B, the cooling cover 270 is configured to use the same fluid inlet 232, cooling line 236, fluid outlet 235, fluid destination 234, and cooling pump 233 as is used for the cooling system 230. This allows for fewer components and less complexity of the annealing chamber 200, 200'. In other embodiments, the cooling cover 270 includes a different fluid inlet, cooling line, fluid outlet, fluid destination, and cooling pump as is used for the cooling system 230.

The second region 201 is located next to the one or more ports 298, according to one embodiment. Thus, the cooling cover 270 is configured to lower the temperature of the substrates 299 as the substrate enters or leaves the annealing chamber 200, 200', respectively. In embodiments where the cooling sources 207 is included, the cooling cover 270 is also used to cooperatively cool the substrate 299.

The annealing chamber 200, 200' can also include the vacuum system 285. The vacuum system 285 is configured to lower the pressure of the annealing chamber, so that a low or ultralow vacuum can be maintained. As shown, the vacuum system 285 includes a vacuum pump 286 and a vacuum line 287. The vacuum line 287 is fluidly coupled to the chamber body 210 and the vacuum pump 286.

During use of the annealing chamber 200, 200', the substrate 299 is loaded through the one or more ports 298 onto the substrate carrier 250. The gas flow system 240 supports the substrate carrier 250 by the flow of the gas. The transport system 220 is configured to move the belt 221 along the path 280. The one or more carrier magnets 252 are magnetically coupled to the one or more belt magnets 223. Thus, the substrate carrier 250 also moves along the path 280.

In embodiments using the transport system 220', the space- and time-varying magnetic fields created by the magnetic track coil apparatus 221' move the substrate carrier 250 along the path 280.

The path 280 continues such that the substrate carrier 250 is exposed to heat emanated from the plurality of thermal sources 262. In this manner, the substrate 299 is annealed. Finally, the substrate 299 is unloaded through the one or more ports 298 to the remainder of the processing system 100A, 100B. The annealing chamber 200, 200' can process up to about 150 substrates (wafers) per hour (WPH) for an annealing process that takes about 5 min.

The path 280 can include one or more straight portions 281 and one or more bends 282. The path 280 includes at least four bends 282, according to one embodiment. Although the bends 282 are shown as sharp in FIG. 2A, it is understood that the rate of curvature of the bends can be any value. The number and length of the straight portions 281 and number of bends 282 can be chosen to accommodate any arrangement of the thermal sources 262. Likewise, the number and length of straight portions 281 and bends 282 can be chosen to accommodate any shape and/or volume of the chamber body 210. The speed of the motion of the belt 221 can be varied to change the total thermal energy absorbed by the substrate 299, and thus the total amount of annealing performed on the substrate.

As described above, an annealing chamber is provided. The annealing chamber includes a transport system, a substrate carrier, and a plurality of thermal sources. The transport system is magnetically coupled to the substrate carrier. The transport system moves the substrate carrier along a path. A substrate supported by the substrate carrier is annealed by the thermal sources.

The annealing chamber described herein allows for a higher throughput of substrate (alternatively referred to as a wafer) annealing compared to furnace annealing chambers. Improved wafer-to-wafer (WTW) and within wafer (WIW) uniformity can be achieved with the disclosed annealing chamber, as each wafer experiences a similar processing environment, since each wafer experiences the same path through the annealing chamber. Overall anneal time is also reduced, as sets of thermal sources staggered with different heating temperatures can inherently include preheating and cooling down of substrates. The annealing chamber has a smaller footprint than traditional furnaces, which reduces cost-of-ownership.

While the foregoing is directed to embodiments of the present disclosure, other and further embodiments of the disclosure may be devised without departing from the basic scope thereof, and the scope thereof is determined by the claims that follow.

What is claimed is:

1. An annealing chamber, comprising:
   a transport system configured to generate a moving magnetic field;
   a substrate carrier configured to support a substrate, the substrate carrier comprising a carrier base that includes one or more carrier magnets that are configured to magnetically couple to the transport system;
   a gas flow system positioned between the substrate carrier and the transport system, the gas flow system comprising:
      a gas flow base;
      a plurality of gas flow outlets disposed in the gas flow base; and
      a perforated surface comprising a plurality of perforations, wherein gas is configured to flow from the plurality of gas flow outlets flows through the plurality of perforations to float the substrate carrier over the gas flow system, and
      a heating system comprising a plurality of thermal sources, wherein the transport system is configured to move the substrate carrier along a path using the moving magnetic field of the transport system.

2. The annealing chamber of claim 1, wherein the gas flow system further comprises:
   a gas line fluidly coupled to the plurality of gas flow outlets; and
   a gas source fluidly coupled to the gas line.

3. The annealing chamber of claim 2, wherein the gas comprises a neutral gas.

4. The annealing chamber of claim 1, wherein the path comprises at least four bends.

5. The annealing chamber of claim 1, wherein the transport system comprises:
   a belt;
   a belt actuator configured to drive the belt in the path; and
   one or more belt magnets coupled to the belt, wherein the one or more belt magnets are magnetically coupled to the one or more carrier magnets.

6. The annealing chamber of claim 1, wherein the one or more belt magnets comprises a permanent magnet.

7. The annealing chamber of claim 1, wherein the transport system comprises:
   a magnetic track coil apparatus; and
   a current source configured to provide a current through one or more coils of the magnetic track coil apparatus, wherein the current is varied through the magnetic track coil apparatus such that time-varying and space-varying magnetic fields are created, the time-varying and space-varying magnetic fields coupled to the one or more carrier magnets.

8. An annealing chamber, comprising:
   a transport system configured to generate a moving magnetic field;
   a substrate carrier configured to support a substrate, the substrate carrier comprising:
   a carrier base that includes one or more carrier magnets that are configured to magnetically couple to the transport system;
   a gas flow system positioned between the substrate carrier and the transport system, the gas flow system comprising:
      a gas flow base;
      a plurality of gas flow outlets disposed in the gas flow base; and
      a perforated surface comprising a plurality of perforations, wherein gas is configured to flow from the plurality of gas flow outlets flows through the plurality of perforations to float the substrate carrier over the gas flow system, and a heating system comprising a plurality of thermal sources comprising:
      a first plurality of thermal sources configured to heat the substrate to a first temperature; and a second plurality of thermal sources configured to heat the substrate to one or more temperatures in a range of temperatures, wherein at least one temperature of the range of temperatures is lower than the first temperature,
   wherein the transport system is configured to move the substrate carrier along a path using the moving magnetic field of the transport system.

9. The annealing chamber of claim 8, wherein the plurality of thermal sources further comprises a plurality of cooling sources configured to cool the substrate to a third temperature, wherein the third temperature is lower that at least one of the temperatures of the range of temperatures.

10. The annealing chamber of claim 9, wherein annealing chamber further comprises:
   a chamber wall; and
   a plurality of ports disposed in the chamber wall, the plurality of ports configured to allow passage of the substrate therethrough.

11. The annealing chamber of claim 10, wherein the plurality of cooling sources are disposed adjacent to the plurality of ports.

12. The annealing chamber of claim 8, wherein the heating system further comprises a lid disposed between the plurality of thermal sources and the substrate carrier.

13. The annealing chamber of claim 8, wherein the first plurality of thermal sources comprises one or more heating lamps.

14. An annealing chamber, comprising:
   a transport system configured to generate a moving magnetic field;
   a substrate carrier configured to support a substrate, the substrate carrier comprising a carrier base that includes one or more carrier magnets that are configured to magnetically couple to the transport system;
   a gas flow system positioned between the substrate carrier and the transport system, the gas flow system comprising:
      a gas flow base;
      a plurality of gas flow outlets disposed in the gas flow base; and a perforated surface comprising a plurality of perforations, wherein gas is configured to flow from the plurality of gas flow outlets flows through the plurality of perforations to float the substrate carrier over the gas flow system, and a heating system comprising a plurality of thermal sources; and a cooling system comprising:
   a cooling base;
   a cooling line disposed in the cooling base;
   a cooling inlet fluidly coupled to the cooling line; and
   a cooling pump fluidly coupled to the cooling inlet, the cooling pump configured to flow a fluid, wherein the transport system is configured to move the substrate carrier along a path using the moving magnetic field of the transport system.

15. The annealing chamber of claim 14, wherein the fluid comprises water.

16. The annealing chamber of claim 14, further comprising a cooling cover disposed between the plurality of thermal sources and the substrate carrier.

17. The annealing chamber of claim 16, wherein the annealing chamber comprises a first region and a second region, the cooling cover disposed in the second region.

18. The annealing chamber of claim 16, wherein the cooling cover comprises a cooling inlet fluidly coupled to the cooling cover.

19. The annealing chamber of claim 18, wherein the cooling cover is coupled to the cooling pump.

20. The annealing chamber of claim 14, wherein the one or more carrier magnets comprises a permanent magnet.

* * * * *